United States Patent
Meagher

(10) Patent No.: US 7,504,975 B2
(45) Date of Patent: Mar. 17, 2009

(54) METHOD AND APPARATUS FOR OUTPUT CURRENT CONTROL

(75) Inventor: Thomas Bruce Meagher, Houston, TX (US)

(73) Assignee: ICS Triplex Technology Limited (GB)

( * ) Notice: Subject to any disclaimer, the term of this patent is extended or adjusted under 35 U.S.C. 154(b) by 0 days.

(21) Appl. No.: 11/689,266

(22) Filed: Mar. 21, 2007

(65) Prior Publication Data

US 2008/0018516 A1 Jan. 24, 2008

Related U.S. Application Data

(60) Provisional application No. 60/785,537, filed on Mar. 24, 2006.

(30) Foreign Application Priority Data

May 31, 2006 (EP) .................................. 06114803

(51) Int. Cl.
*H03M 1/12* (2006.01)
(52) U.S. Cl. ................... 341/142; 341/155; 324/123
(58) Field of Classification Search ............... 324/126, 324/713; 361/101; 341/142, 155
See application file for complete search history.

(56) References Cited

U.S. PATENT DOCUMENTS

| 4,535,378 | A | 8/1985 | Endo et al. |
| 4,539,683 | A | 9/1985 | Hahn et al. |
| 4,679,028 | A | 7/1987 | Wilson |
| 5,128,625 | A | 7/1992 | Yatsuzuka et al. |
| 5,293,082 | A | 3/1994 | Bathaee |
| 5,324,989 | A | 6/1994 | Thornton et al. |
| 5,552,881 | A | 9/1996 | Jezwinski et al. |
| 5,594,439 | A | 1/1997 | Swanson |
| 5,621,603 | A | 4/1997 | Adamec et al. |
| 5,774,321 | A | 6/1998 | Kim et al. |
| 5,804,979 | A * | 9/1998 | Lund et al. .................. 324/713 |
| 5,867,014 | A | 2/1999 | Wrathall et al. |
| 5,896,263 | A | 4/1999 | Terdan et al. |
| 5,909,660 | A | 6/1999 | Foote et al. |
| 5,920,452 | A * | 7/1999 | Sullivan ..................... 361/101 |
| 6,061,006 | A | 5/2000 | Hopkins |

(Continued)

FOREIGN PATENT DOCUMENTS

DE 19750349 5/1998

(Continued)

OTHER PUBLICATIONS

European Search Report for European Application 06114802.9, Sep. 5, 2006, European Patent Office.

(Continued)

*Primary Examiner*—Jean B Jeanglaude
(74) *Attorney, Agent, or Firm*—Boyle Fredrickson LLP; William R. Walbrun

(57) ABSTRACT

This invention relates to a method and apparatus for output current control. The invention provides an output module slice for controlling an output current comprising: an output field interface controller for controlling an input voltage to a first field effect transistor; an analogue to digital converter connected to read the current flowing through said first field effect transistor and to provide a digital signal dependent thereon to said output field interface controller.

3 Claims, 5 Drawing Sheets

U.S. PATENT DOCUMENTS

| | | | |
|---|---|---|---|
| 6,125,024 | A | 9/2000 | LeComte et al. |
| 6,320,283 | B1 | 11/2001 | Salim et al. |
| 6,351,835 | B1 | 2/2002 | Sakaguchi |
| 6,400,163 | B1 | 6/2002 | Melcher et al. |
| 6,459,599 | B1 | 10/2002 | Agirmann et al. |
| 6,557,131 | B1 | 4/2003 | Arabi |
| 6,594,129 | B1 | 7/2003 | Baba et al. |
| 6,653,963 | B1 | 11/2003 | Barrenscheen et al. |
| 6,657,464 | B1 | 12/2003 | Balardeta et al. |
| 6,768,350 | B1 | 7/2004 | Dickey |
| 2003/0043521 | A1 | 3/2003 | Thiele |
| 2003/0063679 | A1 | 4/2003 | Scrofano |
| 2004/0125007 | A1 | 7/2004 | Pezzini |
| 2005/0135037 | A1 | 6/2005 | Thiery et al. |
| 2005/0154945 | A1 | 7/2005 | Haag et al. |
| 2005/0174273 | A1 | 8/2005 | Luo et al. |
| 2005/0248477 | A1 | 11/2005 | Jongsma et al. |
| 2006/0061303 | A1 | 3/2006 | Hitoshi et al. |

FOREIGN PATENT DOCUMENTS

| | | |
|---|---|---|
| EP | 0325786 | 8/1989 |
| EP | 0789458 | 8/1997 |
| EP | 1322139 | 6/2003 |
| EP | 1545163 | 6/2005 |
| GB | WO 03107019 | 12/2003 |
| JP | 55096708 | 7/1980 |
| JP | 60236073 | 1/1985 |
| JP | 08023244 | 1/1996 |

OTHER PUBLICATIONS

European Search Report For European Application 06114803.7, Sep. 1, 2006, European Patent Office.

European Search Report For European Application 06114806.0, Aug. 30, 2006, European Patent Office.

European Search Report For European Application 06114800.3, Sep. 1, 2006, European Patent Office.

European Search Report For European Application 06114804.5, Aug. 18, 2006, European Patent Office.

European Search Report For European Application 06114805.2, Aug. 24, 2006, European Patent Office.

European Search Report For European Application 06114801.1, Sep. 11, 2006, European Patent Office.

Sigma-Delta-ADC in Software, Design&Elektronik, Product Brochure, 1998, pp. 1-18, XP002398239.

* cited by examiner

METHOD AND APPARATUS FOR OUTPUT CURRENT CONTROL

CROSS-REFERENCE TO RELATED APPLICATIONS

This application is related to and claims priority from U.S. Provisional Application No. 60/785,537 filed Mar. 24, 2006 entitled Fault Detection and Apparatus, which is incorporated fully herein by reference.

BACKGROUND a. Field of the Invention

This invention relates to a method and apparatus for output current control.

In safety control systems, fault tolerance is of utmost importance. Fault tolerance is the ability to continue functioning in the event of one or more failures within the system.

Fault tolerance may be achieved by a number of different techniques, each with its specific advantages and disadvantages. One example of fault tolerance is known as Hardware Implemented Fault Tolerance (HIFT). HIFT means that the system relies on robust hardware circuits (as opposed to complex software algorithms) to perform the fault detection and redundancy management functions. A significant advantage HIFT has over software-implemented fault tolerance is that HIFT eliminates the overhead for communications between processors, leaving more time for controlling the process. This makes HIFT systems significantly faster and more dependable than systems using software-implemented fault tolerance.

An example of a HIFT system is a system which provides redundancy, in particular Triple Modular Redundancy (TMR). Using TMR, critical circuits are triplicated and perform identical functions simultaneously and independently. The data output from each of the three circuits is voted in a majority-voting circuit, before affecting the system's outputs. If one of the triplicated circuits fails, its data output is ignored. However, the system continues to output to the process the value (voltage, current level, or discrete output state) that agrees with the majority of the functional circuits. TMR provides continuous, predictable operation.

HIFT and TMR provides for automatic fault recovery with no disruption to system operation and ensures minimal fault detection periods.

Another approach to fault tolerance is the use of hot-standby modules. This approach provides a level of fault tolerance whereby the standby module maintains system operation in the event of module failure. With this approach there may be some disruption to system operation during the changeover period if the modules are not themselves fault-tolerant.

Fault tolerant systems ideally create a Fault Containment Region (FCR) to ensure that a fault within the FCR boundary does not propagate to the remainder of the system. This enables multiple faults to co-exist on different parts of a system without affecting operation.

Fault tolerant systems generally employ dedicated hardware and software test and diagnostic regimes that provide very fast fault recognition and response times to provide a safer system.

Commonly, it is possible to repair faults without interrupting system operation (known as hot replacement). For example active and standby modules may operate in parallel so that if an active module becomes faulty there is an automatic change over to a standby module.

Safety control systems are generally designed to be 'fail-operational/fail-safe'. Fail operational means that when a failure occurs, the system continues to operate: it is in a fail-operational state. The system should continue to operate in this state until the failed module is replaced and the system is returned to a fully operational state.

An example of fail safe operation occurs, for example if, in a TMR system, a failed module is not replaced before a second failure in a parallel circuit occurs, the second failure should cause the TMR system to shut down to a fail-safe state.

Typical safety control applications include emergency and safety shutdown systems, process control, reactor control, wellhead control, turbine and compressor control, fire and gas detection and abatement, and are applicable to many industries including oil and gas production and refining, chemical production and processing, power generation, paper and textile mills and sewage treatment plants.

SUMMARY OF THE INVENTION

According to the invention there is provided an output module slice for controlling an output current comprising: an output field interface controller for controlling an input voltage to a first field effect transistor; an analogue to digital converter connected to read the current flowing through said first field effect transistor and to provide a digital signal dependent thereon to said output field interface controller.

Preferably the first field effect transistor is in series with a second field effect transistor and said second field effect transistor is enabled in dependence upon an external enable signal.

Preferably the interface controller is arranged in operation to control the input voltage to the first field effect transistor by generating a pulse ratio modulated signal.

In a preferred embodiment a load is connected to receive the current flowing through the first field effect transistor and in which the voltages on each side of the load are monitored via analogue to digital converters.

In a preferred arrangement each module slice receives an enable signal from another one of said plurality of modules, and in this case, preferably, the load is shared between said plurality of modules and said voltages are monitored by each of said plurality of modules.

BRIEF DESCRIPTION OF THE DRAWINGS

The invention will now be described, by way of example only, with reference to the accompanying drawings in which.

DETAILED DESCRIPTION

Figure 1:
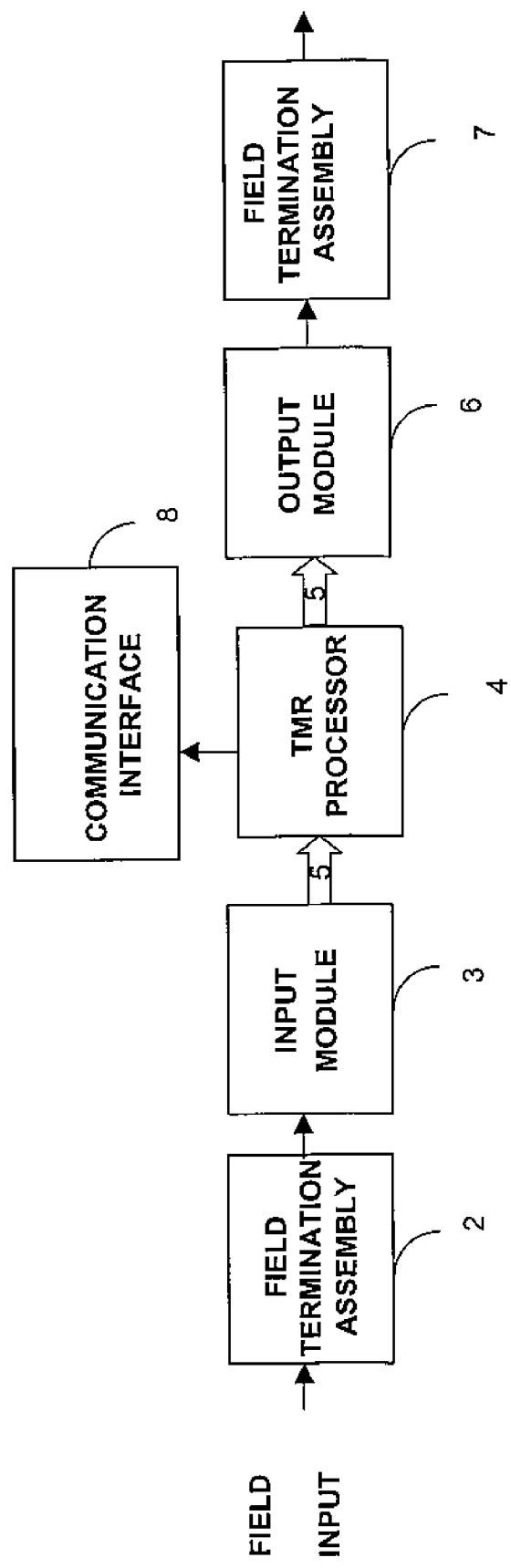
FIG. 1 illustrates schematically a fault tolerant architecture.

Referring now to FIG. 1, signals 1 from an input field device (not shown) are connected to the system via an input Field Termination Assembly (FTA) 2. An input module 3 receives, buffers and carries out any necessary conversion of the input data from the field device. The input data is then transmitted over a triplicated Inter-Module Bus (IMB) 5 to a TMR processor 4. Triplicated microprocessors of the TMR processor receive the input data from each channel of the IMB 5 and carry out a majority vote of the data. During data processing, each of the three processors compares and majority votes its input data against that of the other two processors. The processors synchronously execute the application program, and the derived output data is transmitted back to the IMB. An output module 6 receives, majority votes, and carries out any necessary conversion of the output data from the TMR processor 4. The output circuits are then driven by the majority-voted command. The output signals are connected to a field device (not shown) via an output FTA 7. A communications interface 8 provides facilities to allow systems to be networked using peer to peer communications links, the collection of Sequence of Events (SOE) data, and connection to other systems.

If an internal circuit in the system fails, it is simply voted out. Comprehensive distributed voting both out-votes failures, preventing them from being propagated into the process, and simplifies the process of identifying where faults have occurred.

Figure 2:
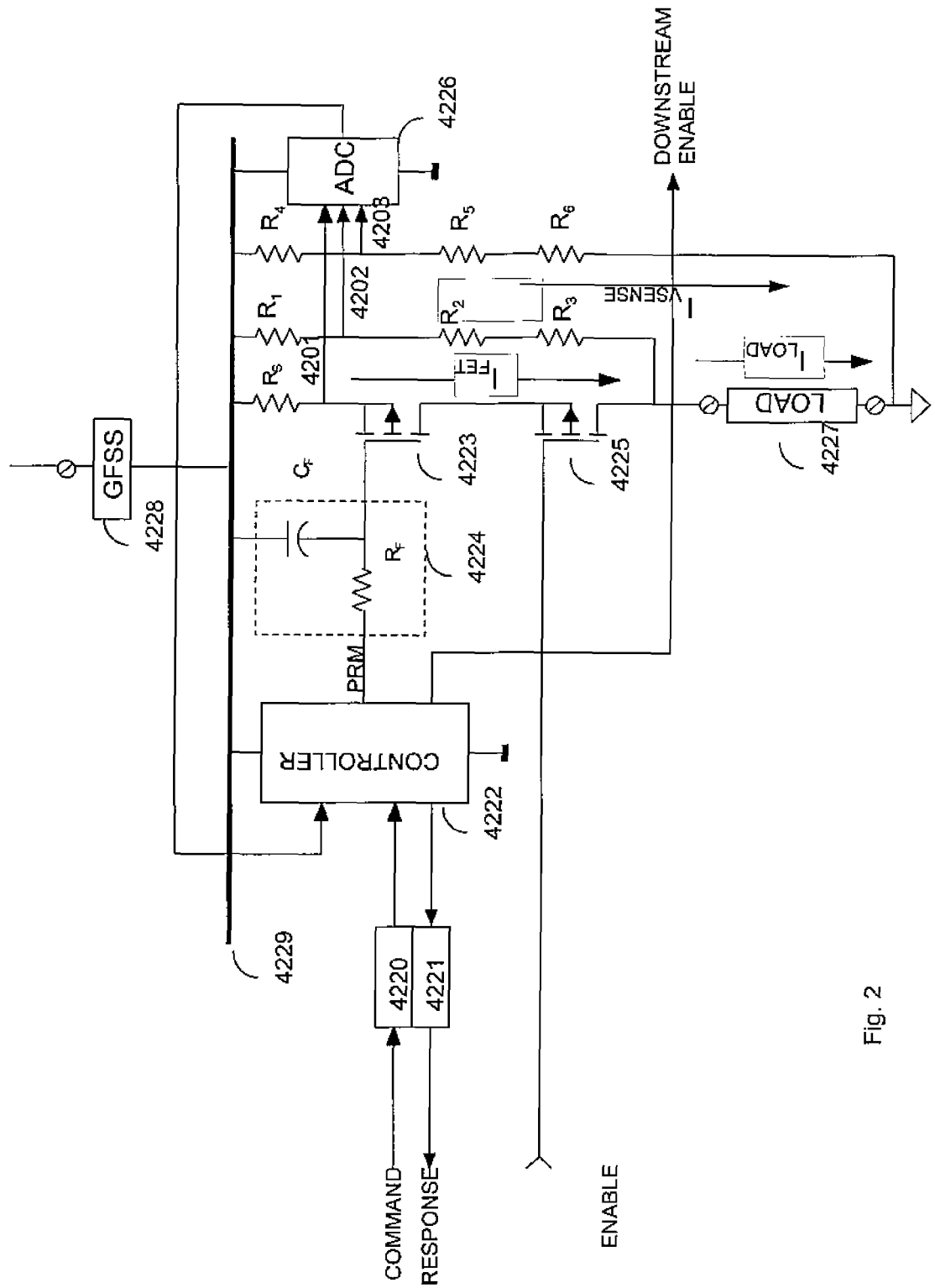
FIG. 2 illustrates an output module slice according to the present invention.

Referring now to FIG. 2 an output module according to a preferred embodiment of the invention will now be described.

A Group Fail-Safe Switch (GFSS) 4228 connects a power source to a power rail 4229 and is arranged to disconnect the power rail 4229 from the power source in the event of more than one fault being detected that would otherwise result in a non-failsafe failure.

Two optical isolators 4220, 4221 serve to transmit and receive data to and from a field interface controller 4222. The field interface controller 4222 performs control and monitoring functions. It generates a high-frequency Pulse Ratio Modulation (PRM) signal used to control the gate voltage to a first field effect transistor 4223. The PRM signal is converted to a DC voltage signal by an RC filter 4224.

The first field effect transistor 4223 is connected in series with a second field effect transistor 4225. The first field effect transistor 4223 is controlled by the signal from the controller 4222 (operating in its linear region) to regulate the current through the transistor to a desired value. The second field effect transistor 4225 is disabled in the event that a fault is detected and thus disables any current output from the output module. A load 4227 is connected to the drain of the field effect transistor 4225 taking advantage of the natural current source characteristic of the output FET 4225.

An array of 12 bit Analogue to Digital Converters (ADC) 4226 converts a number of analogue signals to a digital signal for monitoring and diagnostic purposes.

The ADCs 4226 measure the following:
current 4201 through the field effect transistors 4223, 4225
voltage 4202 at the top of the load 4227
voltage 4203 at the bottom of the load 4227.

Resistor networks R1, R2, R3, R4, R5, R6 scale the load voltage measurements into the range of the ADCs 4226.

The current 4201 and the voltage 4202 are fed back to the controller 4222 to control the generation of the PRM signal as will now be described with reference to FIGS. 3 and 4.

Figure 3:
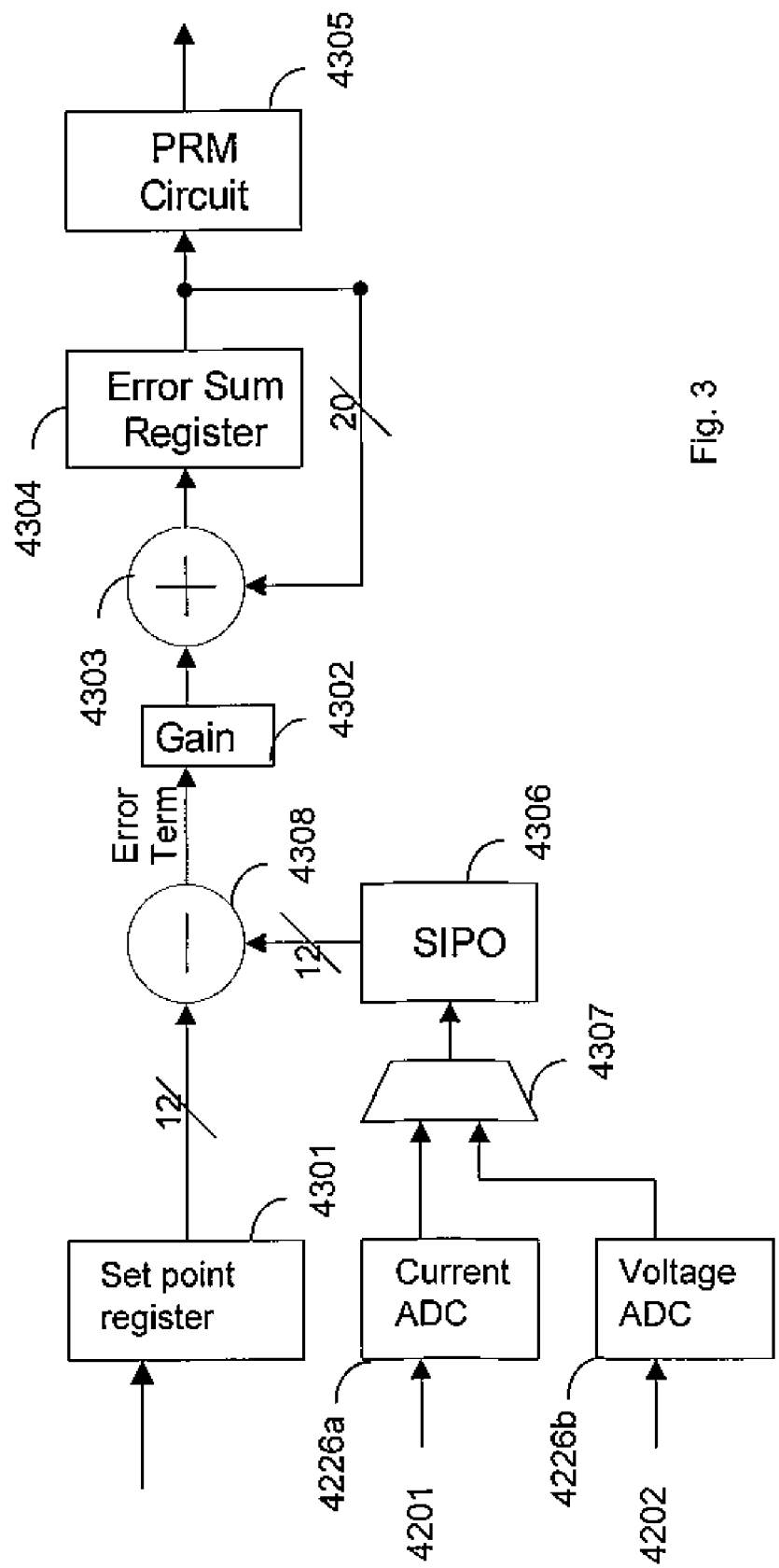
FIG. 3 illustrates utilization of a pulse ratio modulation signal in a closed loop feedback controller.

FIG. 3 illustrates generation of a pulse ratio modulation signal in response to a feed back signal and an input setpoint command signal.

A set point register 4301 is set by the controller 4222 in dependence upon an output current command value received from the optical isolator 4220. The set point is based on previously performed calibration. A multiplexer 4307 selects whether the monitored voltage 4202 or the monitored current 4201 is used to control the gate of the FET 4223. Usually the current 4201 is selected but in certain failure conditions the voltage 4202 may be selected.

A serial in parallel out register 4306 converts a serial A/D value of the monitored current to a parallel data signal.

A subtractor 4308 generates the difference between the set point value and the monitored current 4201 (or voltage 4202) to create an error term. After gain adjustment by a gain function block 4302 the error term is integrated into a 20 bit error sum register 4304 via ad adder 4303. The 16 most significant bits comprise a PRM command and are presented to the PRM Circuit 4305 to produce a high frequency digital signal which is externally low pass filtered by and used to drive the gate of the FET 4223.

Figure 4:
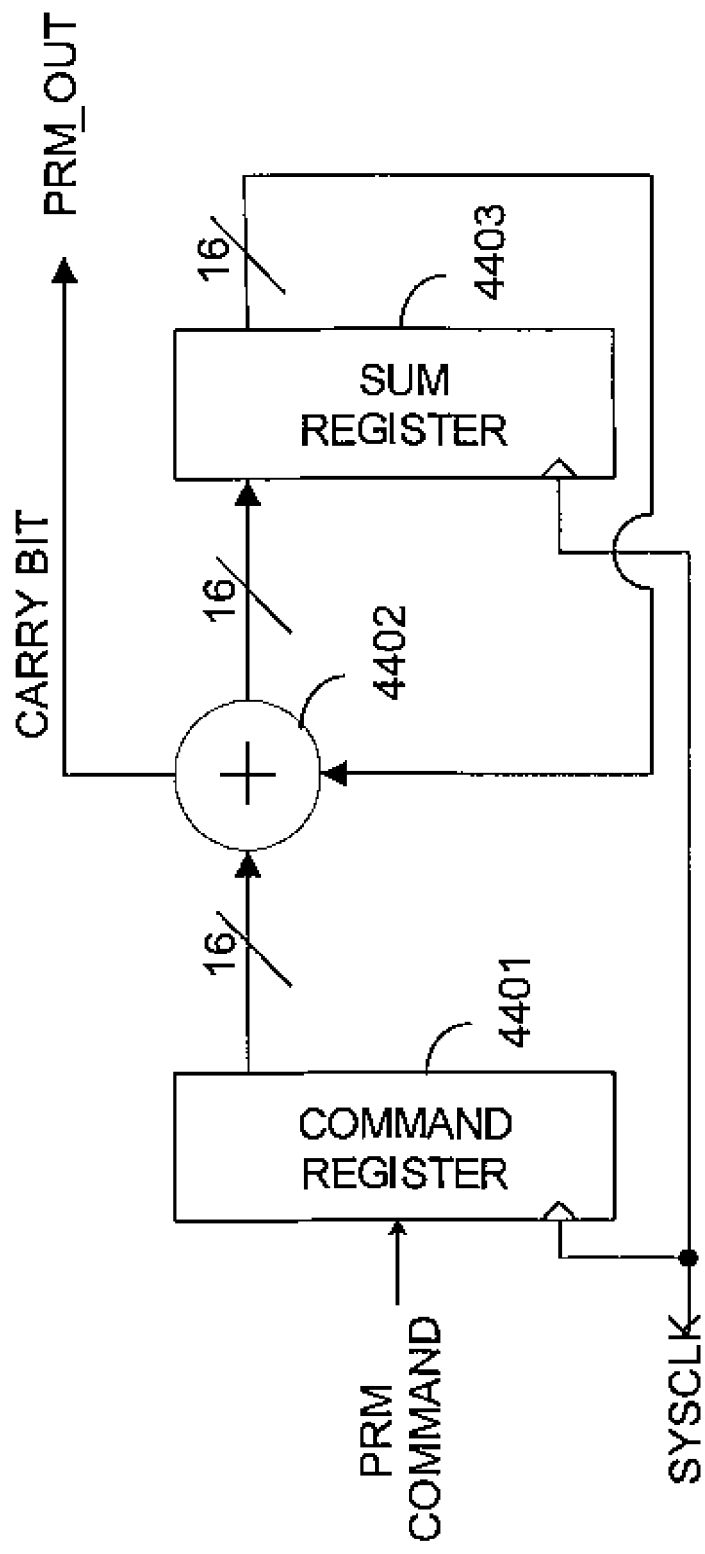
FIG. 4 illustrates the internal structure of a pulse ratio modulation signal generation sub-circuit.

Referring now to FIG. 4, the PRM Circuit 4305 will now be described in more detail.

The PRM command is used to set the ratio of one's to zero's in a PRM_OUT signal. When the command is zero, the PRM_OUT signal will be always zero. A command value of one will result in a single one every $2^{16}$ (65536) (assuming a sixteen bit PRM implementation) clock periods, a command value of two will result in a single one every 32768 clock periods, etcetera, up to an command value of 65535, which will result in a single zero pulse every 65536 clock periods.

This is accomplished by accumulating an input value stored in a command register 4401 with a value in a SUM register 4403, and taking an unsigned arithmetic carry bit as the output. This has the effect of producing a digital output stream at PRM_OUT that has an optimally balanced distribution of one's and zero's within a sliding $2^{16}$ (65536) clock window.

Referring back now to FIG. 2, the resistors from the top of the load 4227 to the power rail 4229 are of particular significance, as they constitute an additional path for current ($I_{VSENSE}$), to flow into the load 4227 which must be corrected for in software. This current also sets the lower limit to the current, which flows into the load 4227 in the OFF state. This current can be reduced by scaling the resistors to larger values, but not eliminated, unless load voltage measurement is eliminated entirely, reducing the fault diagnostic capabilities. The series value of these resistors for the circuit boards as in the preferred embodiment is 220K.

Figure 5:
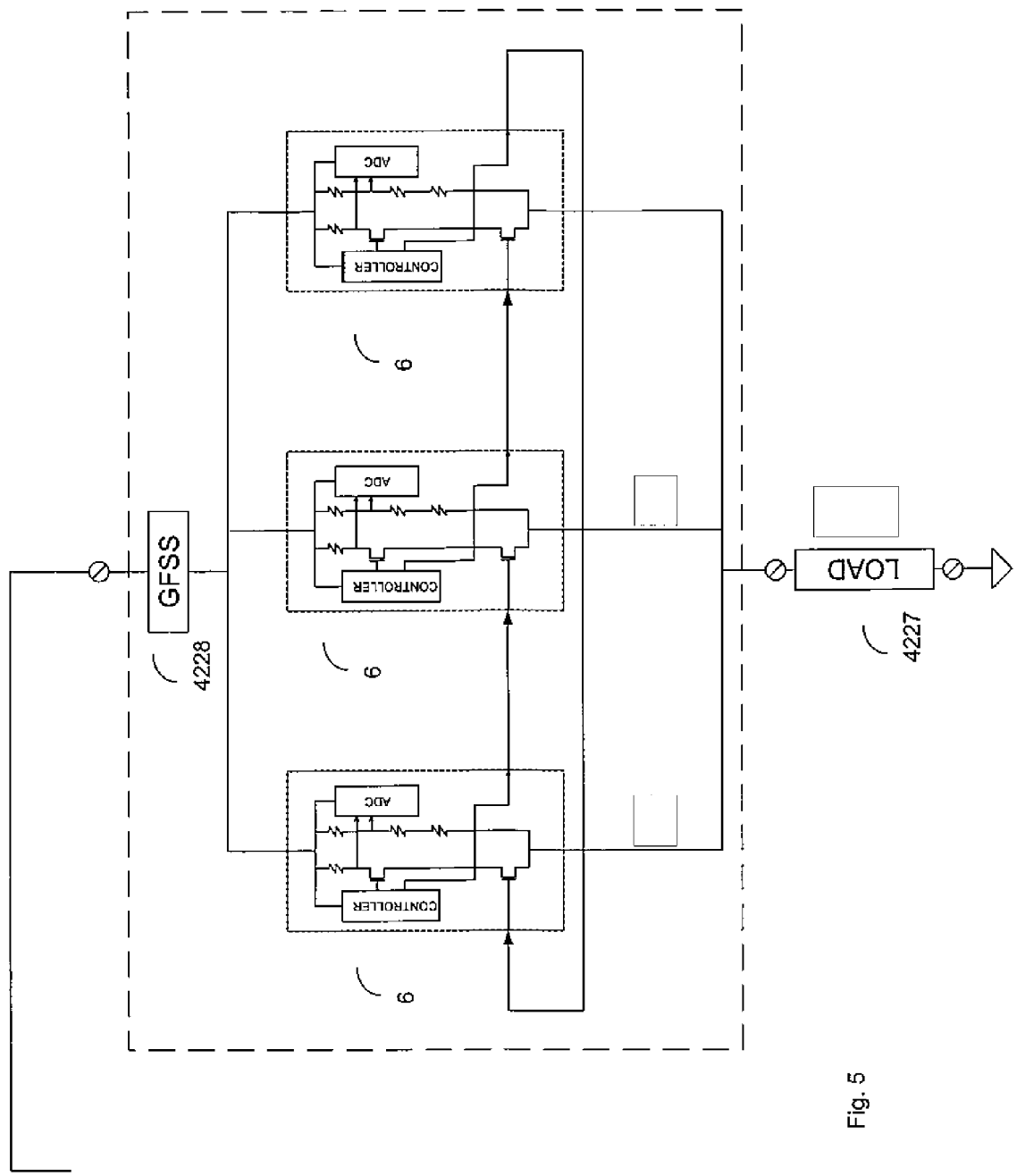
FIG. 5 illustrates a triplicated array of output module slices, constituting one triplicated output module channel.

FIG. 5 illustrates schematically a fault tolerant triplicated network of output module slices 6.

Each output module slice is enabled by an output signal from the controller of a neighbouring output module such that the modules are connected in a circular fashion to produce a 2 out of 3 voted failsafe output current. i.e. (A and B) or (A and C) or (B and C) must be true to enable the output current to flow.

The module slices are also connected via an interslice link (ISL) not shown in the figure, which allows the three module slices to share and vote data between themselves, and to synchronize their operations in a coordinated fashion.

Fault tolerance and fault recovery is provided by software in each slice that continuously monitors the shared data from the other two slices. The analogue load voltage signal for each channel is shared by the three modules and is critical to each slice checking on the operation of the other slices.

It is to be recognised that various alterations, modifications, and/or additions may be introduced into the constructions and arrangements of parts described above without departing from the scope of the present invention as defined in the following claims.

The invention claimed is:

1. A module comprising a plurality of output module slices each module slice comprising:

an output field interface controller for controlling an input voltage to a first field effect transistor;

an analogue to digital converter connected to read the current flowing through said first field effect transistor and to provide a digital signal dependent thereon to said output field interface controller and in which said first field effect transistor is in series with a second field effect transistor and said second field effect transistor is enabled in dependence upon an external enable signal; and, in which each module slice receives an enable signal from another one of said plurality of module slices.

2. An output module slice according to claim 1, in which said interface controller is arranged in operation to control the input voltage to the first field effect transistor by generating a pulse ratio modulated signal.

3. An output module slice according to claim 1, in which a load is connected to receive the current flowing through each of the first field effect transistors and in which the voltages on each side of the load are monitored via analogue to digital converters.

* * * * *